United States Patent
Maekawa (10) Patent No.: US 10,747,190 B2
(45) Date of Patent: Aug. 18, 2020

(54) INDUSTRIAL CONTROL APPARATUS WITH SHORT-CIRCUIT DETECTION CONFIGURATION

(71) Applicant: DENSO WAVE INCORPORATED, Chita-gun, Aichi-pref. (JP)

(72) Inventor: Takaaki Maekawa, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 68 days.

(21) Appl. No.: 16/212,893

(22) Filed: Dec. 7, 2018

(65) Prior Publication Data
US 2019/0179283 A1  Jun. 13, 2019

(30) Foreign Application Priority Data
Dec. 7, 2017 (JP) .................. 2017-234994

(51) Int. Cl.
*G01R 31/02* (2006.01)
*G05B 19/05* (2006.01)
*G01R 31/50* (2020.01)

(52) U.S. Cl.
CPC ............ *G05B 19/05* (2013.01); *G01R 31/50* (2020.01); *G05B 2219/15004* (2013.01)

(58) Field of Classification Search
CPC ... B62D 5/0484; B62D 5/0487; H02P 29/024; G01R 31/50; G01R 31/3835; G01R 31/54; G01R 31/389; G01R 31/52
See application file for complete search history.

(56) References Cited

U.S. PATENT DOCUMENTS

| | | | | |
|---|---|---|---|---|
| 6,198,612 B1* | 3/2001 | Manner | .................. | G01R 31/52 361/86 |
| 9,739,822 B2* | 8/2017 | Onodera | ................ | G01R 31/52 |
| 2005/0184688 A1* | 8/2005 | Hirochi | ..................... | H02P 6/12 318/400.32 |
| 2014/0300377 A1* | 10/2014 | Onodera | ................ | G01R 31/50 324/750.3 |
| 2015/0268289 A1* | 9/2015 | Onodera | ................ | G01R 31/52 324/750.3 |

* cited by examiner

*Primary Examiner* — Alesa Allgood
(74) *Attorney, Agent, or Firm* — Oliff PLC (57) ABSTRACT

The present disclosure provides an industrial control apparatus that minimizes the increase in time taken for detecting a short-circuit in the apparatus and the decrease in the number of unoccupied terminals of a microcomputer due to detection of a short-circuit event. The industrial control apparatus includes first and second voltage supplying units, first and second circuits, an amplification command circuit, and a voltage amplifier incorporated into the first circuit. The amplification command circuit compares the input signal from the first circuit with that of the second signal, and if the comparison results in agreement, outputs to the voltage amplifier an amplification command signal indicating an amplification factor that allows a pre-amplified signal inputted to the voltage amplifier after being amplified to have a voltage out of the range of detecting connection or non-connection of the first input device to the first circuit.

4 Claims, 5 Drawing Sheets

FIG.3
SHORT-CIRCUITED STATE

INDUSTRIAL CONTROL APPARATUS WITH SHORT-CIRCUIT DETECTION CONFIGURATION

CROSS-REFERENCE TO RELATED APPLICATION

This application is based on and claims the benefit of priority from earlier Japanese Patent Application No. 2017-234994 filed Dec. 7, 2017, the description of which is incorporated herein by reference.

BACKGROUND

Technical Field

The present disclosure relates to detecting a short-circuit event which may occur in an industrial control apparatus.

Related Art

Industrial control apparatuses are used for controlling industrial machinery such as industrial robots, or industrial facilities such as industrial air conditioners. An industrial robot, for example, is controlled by a robot controller driving a robot-controlling actuator according to information derived from various sensors such as a position sensor and a temperature sensor. Industrial control apparatuses used for such industrial robots perform processes such as of analogue-to-digital conversion of signals received from various sensors, determining actions to be taken by actuators, and outputting command signals to the robot controller. When a switch device for urgently stopping the motion of an industrial robot is connected to such an industrial control apparatus and if the switch device is operated, the industrial control apparatus outputs a command signal for stopping the motion of the industrial robot.

The industrial control apparatus may have a configuration of including a plurality of switch devices connected thereto to urgently stop a plurality of robots respectively, or to ensure a redundant system for fail-safe. In this configuration, the plurality of switch devices are connected to a microcomputer via respective circuits so that the microcomputer can determine whether the switch devices have been operated. However, if a short-circuit occurs between two or more circuits in this configuration, the operations of the switch devices may be erroneously detected. In this regard, a patent literature JP 2015-179025 A discloses a method of detecting a short-circuit between two circuits. According to this method, a test signal is periodically fed to the circuits in turn, so that a short-circuit can be detected based on the test signals received through the circuits.

However, the method of periodically feeding a test signal to the circuits in turn as disclosed in JP 2015-179025 A cannot detect a short-circuit that has occurred in a circuit, unless the time of feeding a test signal to this circuit in question has arrived. Therefore, a long time may be taken for this method to detect a short-circuit. Furthermore, the need of connecting circuits to the respective terminals of a microcomputer for input and output of the test signal may lead to reducing the number of unoccupied terminals.

Not being limited to the switch devices for emergency stop, the issues set forth above may be caused in industrial control apparatuses, to which input devices are optionally connected for input of data therein, when detecting a short-circuit in the circuits connecting the input devices to the industrial control apparatuses. Also, the issues set forth above may be caused not only in the industrial control apparatuses used for controlling industrial robots, but also in the industrial control apparatuses provided with an AD converter and used for controlling optional industrial facilities or industrial machinery. Under such circumstances of industrial control apparatuses, it is desired to develop a technique for minimizing increase in time taken for detecting a short-circuit event, and minimizing decrease in the number of unoccupied terminals of a microcomputer due to detection of a short-circuit.

SUMMARY

It is thus desired to implement the following modes to solve at least part of the issues set forth above.

(1) According to an aspect of the present disclosure, an industrial control apparatus is provided. The industrial control apparatus includes a microcomputer, a first voltage supplying unit, a second voltage supplying unit, a first circuit, a second circuit, an amplification command circuit, and a voltage amplifier. The first voltage supplying unit outputs a signal of a first voltage. The second voltage supplying unit outputs a signal of a second voltage different from the first voltage. The first circuit has a first connection terminal and electrically connects the first voltage supplying unit and the microcomputer when a first input device is connected to the first connection terminal. The second circuit has a second connection terminal and electrically connects the second voltage supplying unit and the microcomputer when a second input device is connected to the second connection terminal. The amplification command circuit is electrically connected to the first circuit and the second circuit and compares an input signal from the first circuit with an input signal from the second circuit to output an amplification command signal indicating an amplification factor corresponding to the comparison result. The voltage amplifier is incorporated in the first circuit and electrically connected to the amplification command circuit and, upon reception of the amplification command signal, amplifies a pre-amplified signal with the amplification factor indicated by the amplification command signal for output to the microcomputer, the pre-amplified signal being inputted to the voltage amplifier from the first voltage supplying unit via the first connection terminal.

In the apparatus, the microcomputer includes an operation detecting unit that detects (or determines, checks) connection or non-connection of the first input device and occurrence of a short-circuit event (simply a short-circuit) between the first circuit and the second circuit, based on a voltage of a signal inputted from the voltage amplifier. In the apparatus, the amplification command circuit outputs to the voltage amplifier the amplification command signal indicating an amplification factor that allows the pre-amplified signal after being amplified to have a voltage out of a range of detecting connection or non-connection of the first input device, if the comparison indicates agreement between the input signals.

According to the industrial control apparatus of this aspect, when the comparison results in agreement, an amplification command signal is outputted to the voltage amplifier, with an amplification factor that allows the pre-amplified signal after being amplified to have a voltage that is out of the range of detecting connection or non-connection of the first input device. Therefore, after reception of the signal inputted from the voltage amplifier, the operation detecting unit of the microcomputer can detect a short-circuit in a short time. Thus, increase in time taken for detecting a short-circuit can be minimized compared to the configuration in which a test signal is periodically supplied to the first and second circuits in turn to detect a short-circuit based on reception of the signal.

The operation detecting unit of the microcomputer detects connection or non-connection of the first input device and occurrence of a short-circuit between the first and second circuits, based on the voltage of the signal inputted from the voltage amplifier. Further, if a short-circuit occurs, the voltage amplifier amplifies the pre-amplified signal based on an amplification command signal received from the amplification command circuit, so that the amplified signal will have a voltage that is out of the range of detecting connection or non-connection of the first input device, and outputs the amplified signal to the microcomputer. Therefore, a single terminal can be used for both a signal for detecting connection or non-connection of the first input device, and a signal for detecting occurrence of a short-circuit between the first and second circuits. Thus, decrease in the number of unoccupied terminals due to detection of a short-circuit can be minimized.

In addition, if a short-circuit occurs, the input signal of the first circuit agrees with the input signal of the second circuit. Therefore, if the comparison in the amplification command circuit results in agreement, the pre-amplified signal is amplified with an amplification factor so that the amplified signal will have a voltage out of the range of detecting connection or non-connection of the first input device. Thus, the operation detecting unit of the microcomputer can detect occurrence of a short-circuit with high accuracy, thereby minimizing erroneous detection of a short-circuit. Since the pre-amplified signal is amplified with an amplification factor of allowing the amplified signal to have a voltage out of the range of detecting connection or non-connection of the first input device, the signal after being amplified can be accurately specified as to whether the signal is one indicating connection or non-connection of the first input device, or one indicating occurrence of a short-circuit event, thereby minimizing erroneous detection of a short-circuit.

(2) In the industrial control apparatus of the aspect set forth above, the amplification factor corresponding to the comparison being agreement may allow the pre-amplified signal inputted to the microcomputer after being amplified to have a voltage that is out of a range of the case where noise mingles in the pre-amplified signal after being amplified with an amplification factor corresponding to the comparison being disagreement.

According to the industrial control apparatus of this aspect, with the comparison being agreement in the amplification command circuit, i.e. if there is a short-circuit between the first and second circuits, the amplification factor will be one that allows the pre-amplified signal inputted to the microcomputer after being amplified to have a voltage that is out of the range of the case where noise mingles in the pre-amplified signal after being amplified with an amplification factor corresponding to the comparison being disagreement (i.e. the case where there is no short-circuit occurring between the first and second circuits). Thus, even when noise mingles in the amplified signal in the absence of a short-circuit, erroneous detection of a short-circuit is minimized.

(3) According to the industrial control apparatus of the aspect set forth above, the apparatus may further include a sensor, an input module, a programmable logic controller, and an output module. The input module receives an input of a signal outputted from the sensor to convert the signal. The programmable logic controller produces a command signal according to the signal converted by the input module. The output module outputs the command signal produced by the programmable logic controller to a robot controller that controls a robot. The first input device and the second input device may respectively serve as switch devices that stop motion of the robot. Connection or non-connection of the first input device may be operation or non-operation of the switch devices.

According to the industrial control apparatus of this aspect, an industrial control apparatus used for the configuration of controlling a robot according to the signal inputted from a sensor, can minimize increase in time taken for detecting a short-circuit and decrease in the number of unoccupied terminals of the microcomputer due to detection of a short-circuit event.

The present disclosure can be implemented in various modes. For example, the present disclosure can be implemented in the mode of an input or output module, a programmable logic controller, or a robot controller used for an industrial control apparatus, or in the mode of a short-circuit detection method in an industrial control apparatus, or in other modes.

DETAILED DESCRIPTION OF THE PREFERRED EMBODIMENTS

With reference to the accompanying drawings, a preferred embodiment and several modifications will now be described.

A. Embodiment

A-1. Configuration of Overall Apparatus

Figure 1:
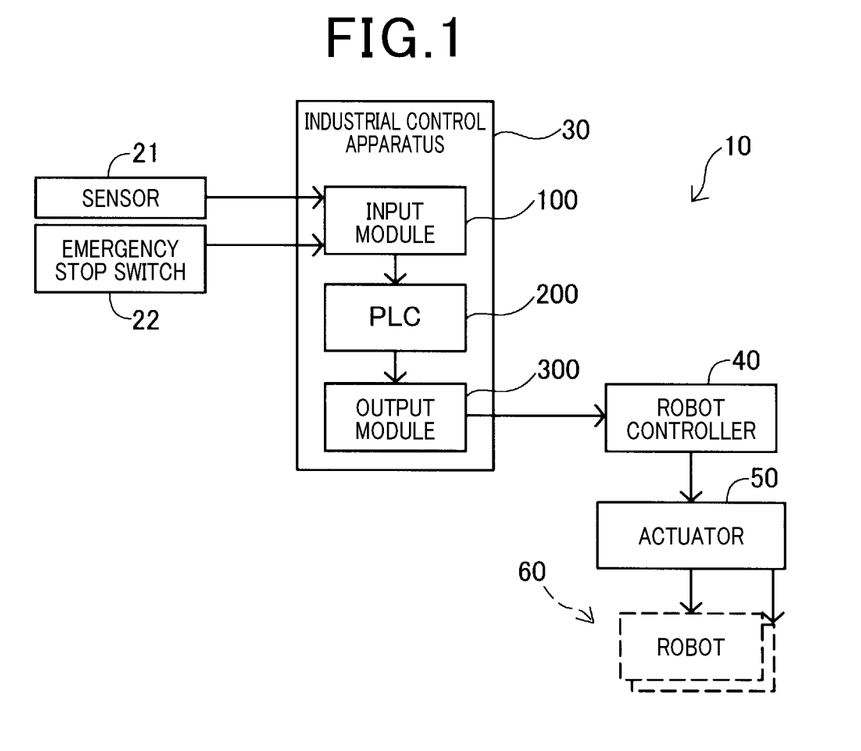
FIG. 1 is a schematic block diagram illustrating a robot control system to which an industrial control apparatus is applied as an embodiment of the present disclosure.

FIG. 1 is a schematic block diagram illustrating a robot control system 10 to which an industrial control apparatus 30 as an embodiment of the present disclosure is applied. The robot control system 10 serves as a system that controls an industrial robot 60 (simply termed robot 60 hereinafter) according to a detection signal derived from a sensor 21 which will be described later. In the present embodiment, the robot 60 includes two robot units. In addition to the sensor 21 and the industrial control apparatus 30, the robot control system 30 includes an emergency stop switch 22, a robot controller 40, and an actuator 50.

The sensor 21 detects parameter values associated with the motion control of the robot 60 and outputs the detected values as analog signals. The parameters associated with the motion control of a robot may, for example, be the positions or angles of the arms or wrists of the robot if the robot 60 is a multijoint industrial robot. Furthermore, for example, the parameters may be the temperature of the environment where the robot 60 operates, or the length of move if the robot 60 is permitted to move, or the weight of workpieces at a predetermined position of a conveyance path if such a conveyance path is equipped for conveying the works processed by the robot 60, or a fluid flow rate if the valve for adjusting the fluid flow rate is controlled by the robot 60.

The emergency stop switch 22 serves as a switch that urgently stops the motion of the robot 60. In the present embodiment, the emergency stop switch 22 is of a pushbutton type that can be easily operated by the user. As will be described later, the emergency stop switch 22 includes two switch units (first and second switch units 22a and 22b described later) respectively connected to different circuits (first and second circuits C1 and C2 described later). These two switch units are respectively used for urgently stop the motions of the two robot units constituting the robot 60. The user can depress the emergency switch 22 to stop the motion of the industrial robot 60.

The industrial control apparatus 30 is electrically connected to the sensor 21, the emergency stop switch 22, and the robot controller 40. The industrial control apparatus 30 receives an input of an analog signal outputted from the sensor 21 for conversion into a digital signal, and outputs the digital signal to the robot controller 40. The industrial control apparatus 30 detects (or determines, checks) the operation of the emergency stop switch 22 and the occurrence of a short-circuit event (simply, a short-circuit) between the two circuits connected to the emergency stop switch 22 (termed short-circuit detection function hereinafter). The industrial control apparatus 30 includes an input module 100, a programmable logic controller (PLC) 200, and an output module 300. In the present embodiment, the input module 100 and the programmable logic controller 200 are configured to enable communication therebetween through a given network. Likewise, the programmable logic controller 20 and the output module 300 are configured to enable communication therebetween through a given network.

Examples of the given network include various wired LANs (local area networks) regulated by an IEEE (institute of electrical and electronics engineers) 802.3 standard group, and various wireless LANs regulated by an IEEE 802.11 standard group. Besides LANs, the given network may be WANs (wide area networks). Examples of WANs include mobile communication such as one based on 3G/HSPA, next-generation mobile iMAX (IEEE 802.16m) and next-generation PHS (XG: eXtended global platform), which will be available in the future, wide-area Ethernet (Ethernet is a trademark), a frame relay network, and ATM (asynchronous transfer mode) network. Short-range wireless communication networks may also be used. Examples of the short-range wireless communication networks include ones based on Bluetooth (registered trademark), Zigbee (registered trademark), and IrDA (infrared data association).

The input module 100 receives an input of an analog signal outputted from the sensor 21 for AD conversion into a digital signal, and outputs the digital signal (also termed a converted digital signal hereinafter). Also, the input module 100 detects the operating state of the emergency stop switch 22, i.e. whether the emergency stop switch has been depressed, and outputs the results. The input module 100 has the short-circuit detection function mentioned above, and thus detects a short-circuit, if any, and outputs the results. Details of the configuration of the input module 100 will be described later.

The programmable logic controller 200 produces and outputs a command signal to the output module 300, based on the converted digital signal outputted from the input module 100. The command signal refers to a signal commanding control of the motion of the robot 60. Also, the programmable logic controller 200 outputs a signal commanding motion stop of the robot 60 to the output module 300, if there is an input of a signal from the input module 100 as a result of depressing the emergency stop switch 22. If there is an input of a signal indicating detection of a short-circuit from the input module 100 as well, the programmable logic controller 200 outputs a signal commanding motion stop of the robot 60.

The output module 300 outputs the command signal outputted from the programmable logic controller 200 to the robot controller 40.

In response to the command signal outputted from the industrial control apparatus 30 (output module 300), the robot controller 40 controls the actuator 50. The actuator 50 actualizes the motion of the robot 60. For example, if the robot 60 is configured to have an AC motor, the actuator 50 is configured as an inverter circuit that supplies electrical power to the AC motor. In this configuration, the robot controller 40 outputs a signal for activating the switching element provided to the inverter circuit. For example, the robot controller 40 may be configured by a known microcomputer provided with a CPU and various memories.

A-2. Specific Configuration of the Industrial Control Apparatus

Figure 2:
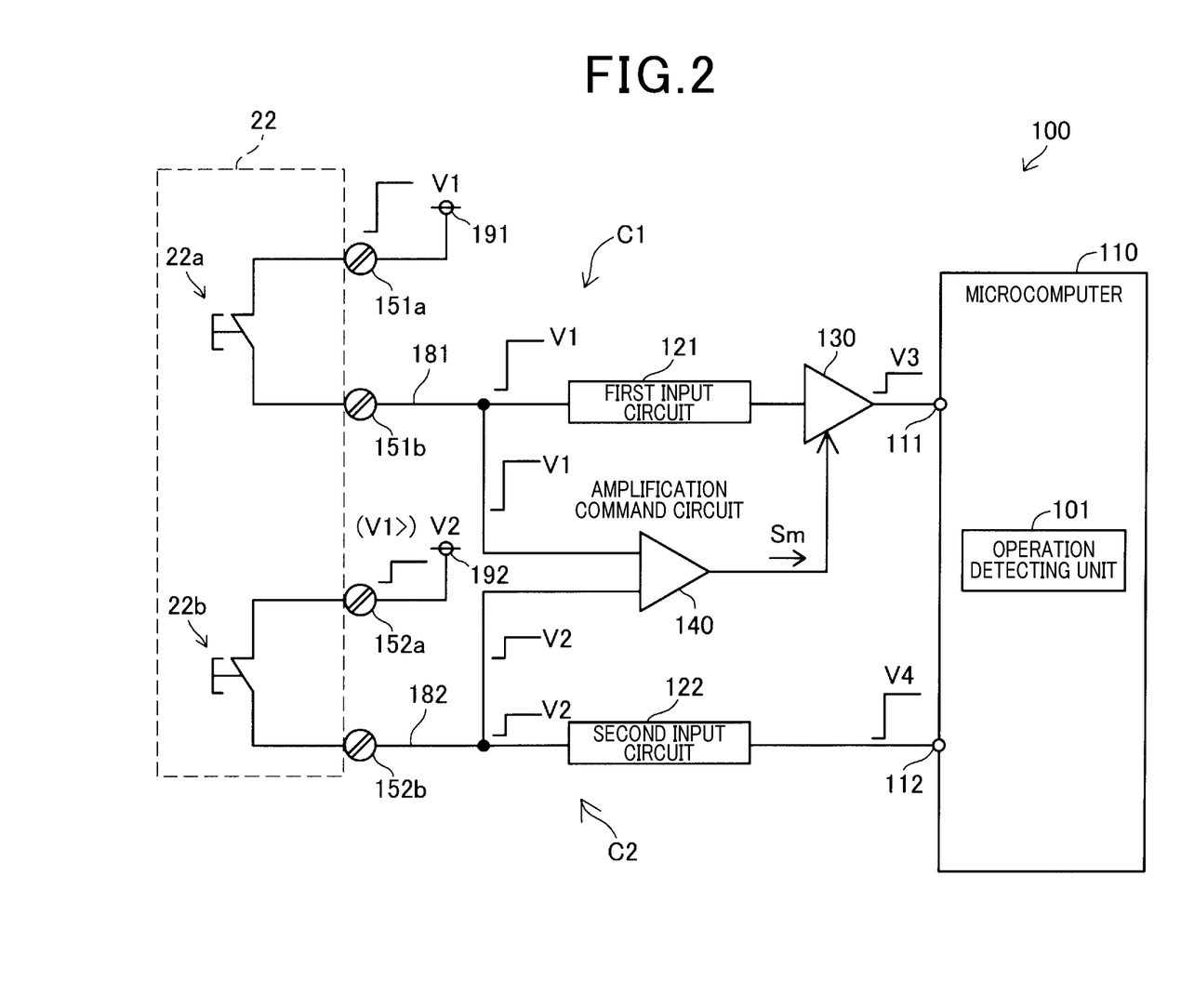
FIG. 2 is a block diagram illustrating a specific configuration of an input module shown in FIG. 1.

FIG. 2 is a block diagram illustrating a specific configuration of the module 100 shown in FIG. 1. The input module 100 is connected to a first switch unit 22a and a second switch unit 22b, serving as the emergency stop switch 22. The input module 100 includes a first voltage supply unit 191, a second voltage supply unit 192, a first circuit C1, a second circuit C2, an amplification command circuit 140, and a known microcomputer 100.

The first voltage supply unit 191 serves as a power source and supplies a predetermined voltage V1. In other words, the first voltage supply unit 191 outputs a direct-current signal of a first voltage V1. Likewise, the second voltage supply unit 192 serves as a power source and supplies a predetermined voltage V2. In other words, the voltage supply unit 192 outputs a direct-current signal of a second voltage V2. The first and second voltages V1 and V2 are different from each other. In the present embodiment, the first voltage V1 is greater than the second voltage V2. For example, the voltage V1 may be 24V, and the voltage V2 may be 15V. Conversely, the first voltage V1 may be smaller than the second voltage V2.

The first circuit C1 includes two connection terminals 151a and 151b, a first input circuit 121, and a voltage amplifier 130.

The two connection terminals 151a and 151b are connected to the first switch unit 22a. The connection terminal 151a is connected to the first voltage supply unit 191. The connection terminal 151b is connected to a line 181. If the first switch unit 22a is not being depressed, the first voltage supply unit 191 and the line 181 are electrically connected through the first switch unit 22a and the two connection terminals 151a and 151b. If the first switch unit 22a has been depressed, the connection terminals 151a and 151b are electrically insulated from each other and accordingly, the first voltage supply unit 191 is electrically insulated from the line 181. The two connection terminals 151a and 151b correspond to the subordinate concept of the first connection terminal. The first switch unit 22a corresponds to the subordinate concept of the first input device.

The first input circuit 121 is connected to the line 181 and the voltage amplifier 130, and converts and outputs the voltage of a signal inputted from the line 181 so as to be suitable for the input into the microcomputer 110. For example, if the first switch unit 22a is not being depressed, a signal with a voltage of 24V is inputted from the line 181. The first input circuit 121 converts this voltage 24V into 3.3V and outputs the signal.

The voltage amplifier 130 is connected to the first input circuit 121 and a terminal 111 of the microcomputer 110. The voltage amplifier 130 amplifies a signal inputted from the first input circuit 121 (termed pre-amplified signal hereinafter) and outputs the amplified signal to the microcomputer 110. The voltage amplifier 130 is electrically connected to the amplification command circuit 140. The voltage amplifier 130 receives an amplification command signal Sm, which will be described later, from the amplification command circuit 140, and amplifies the pre-amplified signal with an amplification factor indicated by the amplification command signal Sm.

The second circuit C2 includes two connection terminals 152a and 152b, and a second input circuit 122.

The two connection terminals 152a and 152b are connected to the second switch unit 22b. The connection terminal 152a is connected to the second voltage supply unit 192. The connection terminal 152b is connected to a line 182. If the second switch unit 22b is not being depressed, the second voltage supply unit 192 and the line 182 are electrically connected through the second switch unit 22b and the two connection terminals 152a and 152b. If the second switch unit 22b has been depressed, the connection terminals 152a and 152b are electrically insulated from each other and accordingly, the second voltage supply unit 192 is electrically insulated from the line 182. The two connection terminals 152a and 152b correspond to the subordinate concept of the second connection terminal. The second switch unit 22b corresponds to the subordinate concept of the second input device.

The second input circuit 122 has a configuration and function similar to those of the first input circuit 121. Specifically, the second input circuit 122 is connected to the line 182 and a terminal 112 of the microcomputer 110, and converts and outputs the voltage of a signal inputted from the line 182 so as to be suitable for the input into the microcomputer 110. For example, if the second switch unit 22b is not being depressed, a signal with a voltage of 15V is inputted from the line 182. The second input circuit 122 converts this voltage 15V into 3.3V and outputs the signal.

The amplification command circuit 140 is connected to the lines 181 and 182 to compare the input signal from the line 181 (i.e. the input signal from the first circuit C1) with the input signal from the line 182 (i.e. the input signal from the second circuit C2) and output a signal Sm indicative of an amplification factor (termed amplification command signal Sm hereinafter) corresponding to the comparison. The amplification command circuit 140 is electrically connected to the voltage amplifier 130, so that the amplification command signal is inputted to the voltage amplifier 130.

As described above, the first voltage V1 of the signal outputted from the first voltage supply unit 191 is different from the second voltage V2 of the signal outputted from the second voltage supply unit 192. Therefore, in the absence of short-circuit, the input signal from the line 181 to the amplification command circuit 140 is different from the input signal from the line 182 to the amplification command circuit 140. However, if the first and second circuits C1 and C2 are short-circuited, the input signal from the line 181 to the amplification command circuit 140 agrees with the input signal from the line 182 to the amplification command circuit 140. As will be described later, in the occurrence of a short-circuit, the input signal from the line 182 to the amplification command circuit 140 in the present embodiment will have the voltage V1, being pulled up by the greater voltage V1. Depending on the circuit configuration, the input signal from the line 182 to the amplification command circuit 140 may have an unchanged voltage V2, while the input signal from the line 181 to the amplification command circuit 140 may have a voltage changed into the voltage V2, being pulled down by the smaller voltage V2.

The amplification command circuit 140 outputs an amplification command signal Sm indicating an amplification factor differing between when the input signals agree with each other and when disagree with each other as a result of the comparison. Specifically, when the input signals disagree with each other as a result of the comparison, the amplification command circuit 140 outputs an amplification command signal Sm indicating an amplification factor of 0.3, and when agree with each other, outputs an amplification command signal Sm indicating an amplification factor of 0.9. Thus, for example, if neither of the first and second switch units 22a and 22b is depressed and there is no short-circuit occurring between the first and second circuits C1 and C2, the input signals do not agree with each other. Accordingly, an amplification command signal Sm indicating an amplification factor of 0.3 is inputted to the voltage amplifier 130. Consequently, the voltage amplifier 130 amplifies the voltage 3.3 V inputted from the first input circuit 121 by a factor of 0.3, so that an amplified signal of about 3V (third voltage V3 shown in FIG. 2) is outputted to the microcomputer 110. In this case, a signal of 3.3 V (voltage V4 shown in FIG. 2) is outputted from the second circuit C2 (second input circuit 122) to the microcomputer 110.

Figure 3:
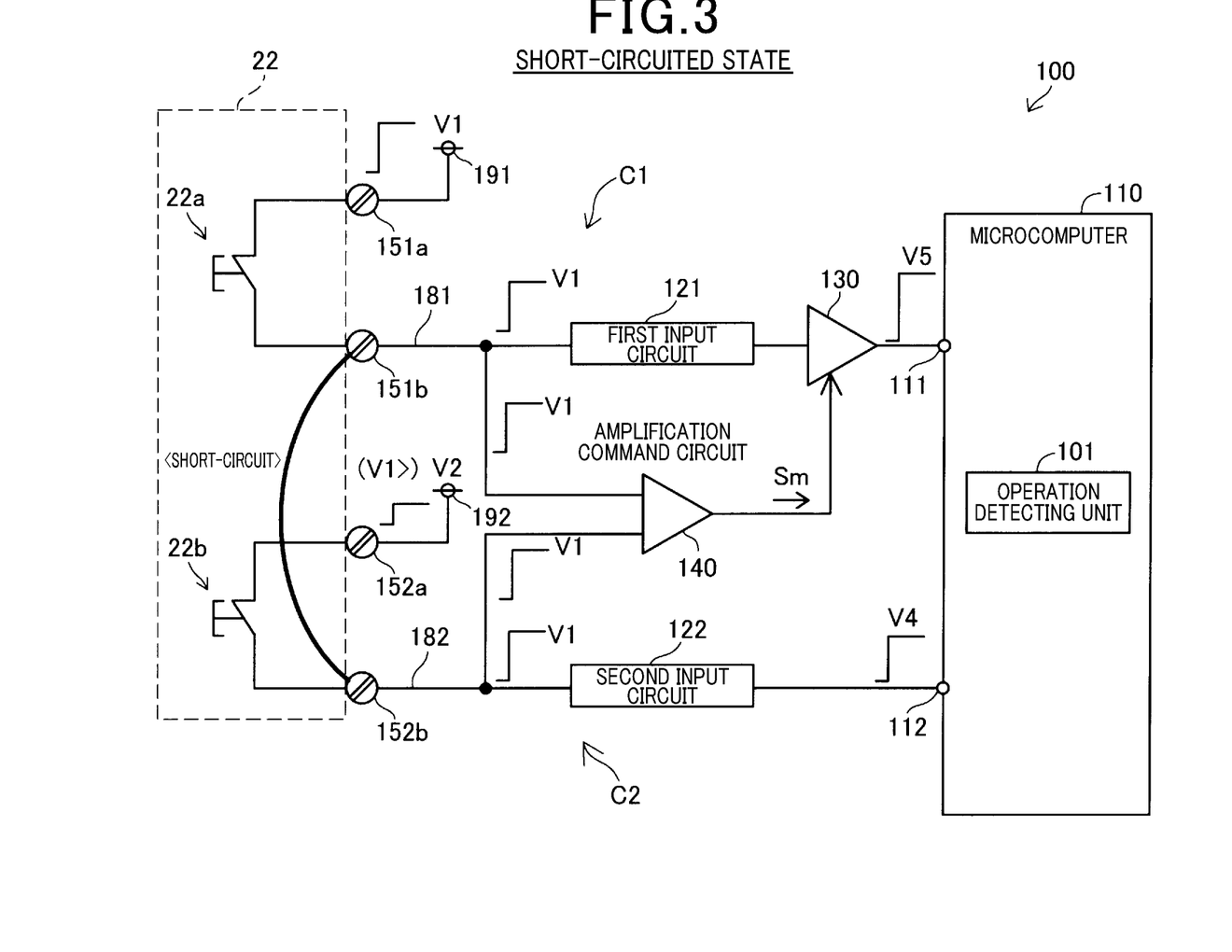
FIG. 3 is a block diagram illustrating a specific configuration of an input module in the occurrence of a short-circuit.

FIG. 3 is a block diagram illustrating an example of a specific configuration of the input module 100 in the occurrence of a short-circuit. In FIG. 3, the connection terminal 151b of the first circuit C1 has been electrically connected to the connection terminal 152b of the second circuit C2, causing a short-circuit between the first and second circuits C1 and C2.

In this example, the line 182 is supplied with the first voltage V1 from the first voltage supply unit 191 through the connection terminals 151b and 152b. Accordingly, the comparison in the amplification command circuit 140 results in "disagreement". Therefore, the amplification command circuit 140 outputs an amplification command signal Sm indicating an amplification factor of 0.9 to the voltage amplifier 130. Thus, the voltage amplifier 130 amplifies the signal of 3.3 V inputted from the first input circuit 121 by a factor of 0.9, so that an amplified signal of 3 V (voltage V5 in FIG. 3) is outputted to the microcomputer 110. In the example shown in FIG. 3, the second input circuit 122 outputs, as in FIG. 2, a signal with a fourth voltage (3.3 V) to the microcomputer 110.

As shown in FIGS. 2 and 3, the microcomputer 110 includes a CPU and various memories including a ROM and a RAM. The CPU reads a predetermined program from, for example, the ROM (i.e., a non-transitory computer readable recording medium), and carry out the respective steps defined by the program, whereby the CPU, that is, the microcomputer 110 functionally provides an operation detecting unit 101.

By execution of the predetermined program, the operation detecting unit 101 detects (or determines, checks) the operating state of the emergency stop switch 22 and the occurrence of a short-circuit between the first and second circuits C1 and C2. Although not shown, the microcomputer 110 includes an A/D conversion unit that converts the analog signals inputted from the terminals 111 and 112 into digital signals. The operation detecting unit 101 detects the operating state of the emergency stop switch 22, based on the voltages of the signals that have been inputted from the terminals 111 and 112 and A/D-converted by the A/D conversion unit. Moreover, the operation detecting unit 101 detects the occurrence of a short-circuit, based on the voltage of the signal inputted from the terminal 111 and A/D-converted by the A/D conversion unit. The operation detecting unit 101 detects the operating state of the emergency stop switch 22 and the occurrence of a short-circuit at a predetermined cycle, e.g. every several microseconds.

The following description addresses a specific process of detecting the operating state and the occurrence of a short-circuit performed by the operation detecting unit 101.

A-3. Detection of the Operating State and the Occurrence of a Short-Circuit

Figure 4:
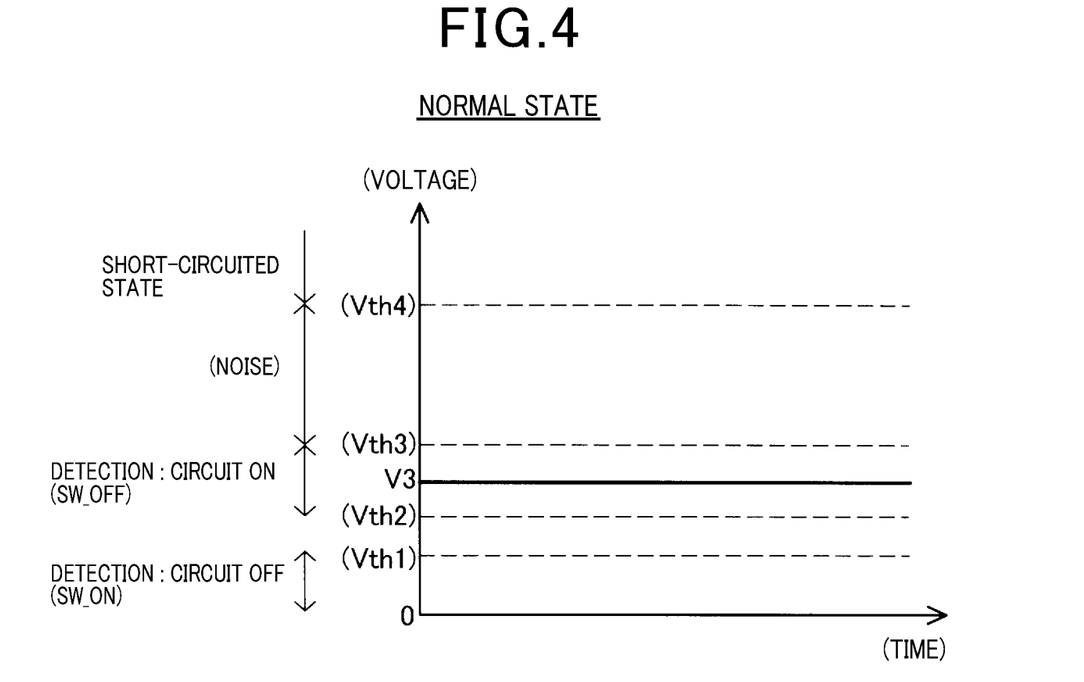
FIG. 4 is a diagram illustrating voltage of signal after being A/D-converted by a microcomputer in a normal state, i.e. when there is no short-circuit.

FIG. 4 is a diagram illustrating voltage of signal after being A/D-converted by the microcomputer 110 when there is no short-circuit. In FIG. 4, the horizontal axis indicates time and the vertical axis indicates voltage.

A plurality of threshold voltages are set in advance in the microcomputer 110 for the operation detecting unit 101 to detect the operating state and the occurrence of a short-circuit. Specifically, the set thresholds include a first threshold voltage Vth1, a second threshold voltage Vth2, a third threshold voltage Vth3, and a fourth threshold voltage Vth4.

The first threshold Vth1 is used for determining disconnection between the first voltage supply unit 191 and the line 181, or between the second voltage supply unit 192 and the line 182, as a result of the first circuit C1 or the second circuit C2 being in an off state, i.e. as a result of the first switch unit 22a or the second switch unit 22b being depressed (turned on). In the present embodiment, the first threshold voltage Vth1 is set to 0.5 V. The operation detecting unit 101 detects that the first switch unit 22a or the second switch unit 22b has been depressed, if the signal inputted from the terminal 111 or 112 is within the voltage range of 0 V or more and 0.5 V or less.

The second and third threshold voltages Vth2 and Vth3 are used for detecting that the first circuit C1 or the second circuit C2 is in an on state, i.e. the first switch unit 22a or the second switch unit 22b is not being depressed (in an off state), and that there is no short-circuit occurring. In the present embodiment, the second threshold voltage Vth2 is set to 0.8 V, and the third threshold voltage Vth3 is set to 1.2 V. If the signal inputted from the terminal 111 or 112 has a voltage in the range of 0.8 V or more and 1.2 V or less, the operation detecting unit 101 detects that the first switch unit 22a or the second switch unit 22b is not being depressed, and there is no short-circuit occurring. The second and first threshold voltages Vth2 and Vth1 are permitted to have a difference therebetween to prevent variation, in short time, in the detection of the operating state performed by the operation detecting unit 101. The variation in the detection may occur due to the voltage variation during transition from the state where the first switch unit 22a or the second switch unit 22b is being depressed to a non-depressed state.

The fourth threshold voltage Vth4 is used for detecting the occurrence of a short-circuit. In the present embodiment, the fourth threshold voltage Vth4 is set to 2.5 V. If the signal inputted from the terminal 111 is 2.5 V or more, the operation detecting unit 101 detects that a short-circuit has occurred.

As described above, the signal inputted to the terminal 111 will have the third voltage V3 (or 1V) if the first circuit C1 or the second circuit C2 is in an on state, i.e. if the first switch unit 22a or the second switch unit 22b is not being depressed (in an off state) and there is no short-circuit occurring. Accordingly, as shown in FIG. 4, the signal inputted to the terminal 111 will have a voltage within the range of the second threshold voltage Vth2 or greater and the third threshold voltage Vth3 or smaller. Consequently, the operation detecting unit 101 detects that neither of the first switch unit 22a and the second switch unit 22b is being depressed, and there is no short-circuit occurring.

Although not shown, if the first switch unit 22a or the second switch unit 22b has been depressed, the signal inputted to the terminal 111 or 112 will have a voltage of 0 V. Accordingly, the voltage of such a signal will be within the range of 0 V or more and the first threshold voltage Vth1 or smaller. Consequently, the operation detecting unit 101 detects that the first switch unit 22a or the second switch unit 22b is in a state of being depressed.

Figure 5:
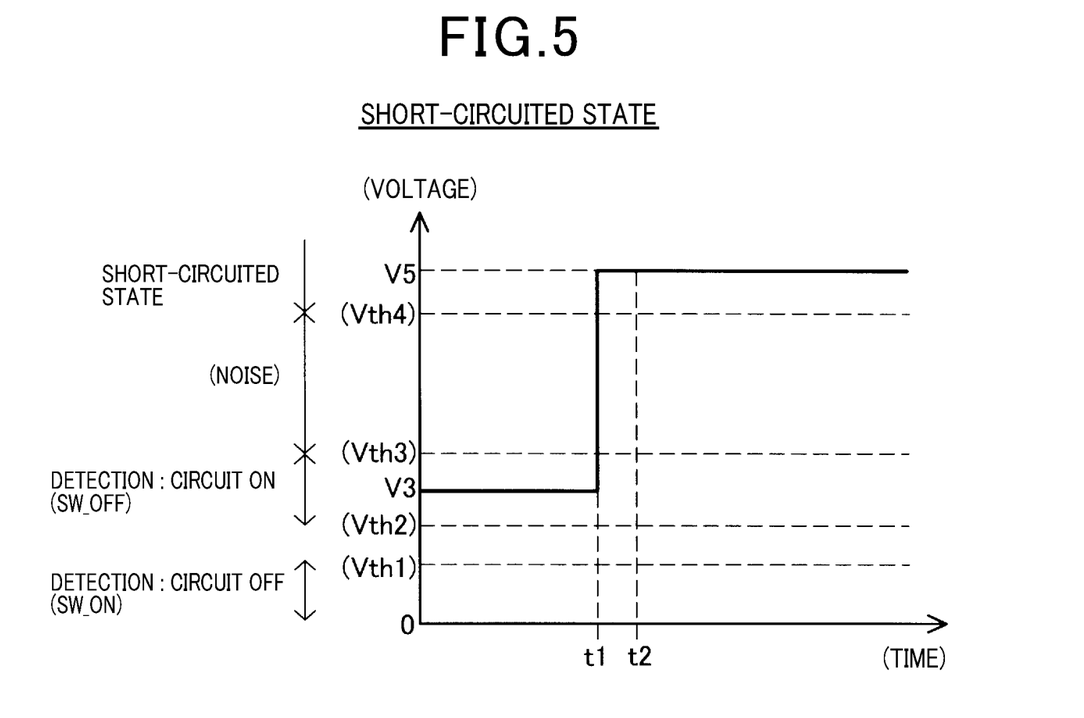
FIG. 5 is a diagram illustrating voltage of signal after being A/D-converted by a microcomputer in the occurrence of a short-circuit.

FIG. 5 is a diagram illustrating voltage of signal after being A/D-converted by the microcomputer 110 in the occurrence of a short-circuit. In FIG. 5, the horizontal axis indicates time, and the vertical axis indicates voltage.

In the example shown in FIG. 5, the short-circuit shown in FIG. 3 occurs at time t1. In this case, the signal inputted to the terminal 111 before time t1 has the third voltage V3 that is the same as the voltage shown in FIG. 4. Accordingly, before time t1, the operation detecting unit 101 detects that the first switch unit 22a or the second switch unit 22b is not being depressed and no short-circuit is occurring.

When a short-circuit occurs at time t1, the signal inputted to the terminal 111 will have the voltage 3V as mentioned above. Therefore, as shown in FIG. 5, the signal inputted to the terminal 111 will have a voltage that is the fourth threshold voltage Vth4 or greater. Then, upon arrival of time t2 for detecting the operating state of the emergency stop switch 22 and the occurrence of a short-circuit, the operation detecting unit 101 detects the occurrence of a short-circuit. The operation detecting unit 101, which operates at a very short cycle, i.e. several microseconds, of detecting the operating state of the emergency stop switch 22 and the occurrence of a short-circuit as mentioned above, can detect the occurrence of a short-circuit in a very short time.

The fourth threshold voltage Vth4 used for detecting the occurrence of a short-circuit is permitted to have a difference from the third threshold voltage Vth3, and the difference is used for detecting noise mingled in the first circuit C1 or the second circuit C2. The third threshold voltage Vth3 is the upper limit among the thresholds used for detecting the state where the first switch unit 22a or the second switch unit 22b is not being depressed and there is no short-circuit occurring. Specifically, if the signal inputted from the terminal 111 or 112 has a voltage greater than the third threshold voltage Vth3 and smaller than the fourth threshold voltage Vth4, the operation detecting unit 101 ignores such a voltage. More specifically, the operation detecting unit 101 detects neither the operating state of the emergency stop switch 22, nor the occurrence of a short-circuit, based on such a voltage.

Figure 6:
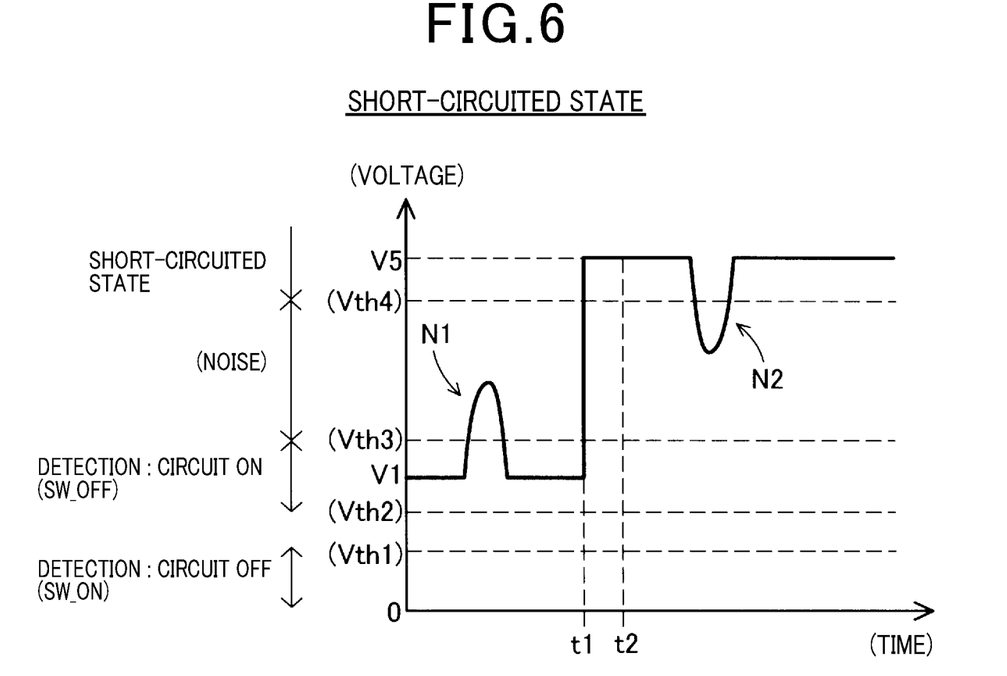
FIG. 6 is a diagram illustrating voltage of signal after being A/D-converted by a microcomputer in the occurrence of a short-circuit.

FIG. 6 is a diagram illustrating voltage of signal after being A/D converted by the microcomputer 110 in the occurrence of a short-circuit. In FIG. 6, the horizontal axis indicates time, and the vertical axis indicates voltage. FIG. 6 shows voltage variation when noise has mingled in the first circuit C1 in the state shown in FIG. 5.

In the example shown in FIG. 6, noise mingles into the first circuit C1 in a normal state, and noise N1 occurs, before time t1, in the signal inputted into the terminal 111. Furthermore, in this example, noise also mingles in the first circuit C1 in the state where the short-circuit has occurred, and noise N2 occurs, after time t2, in the signal inputted from the terminal 111.

As shown in FIG. 6, the voltage in the occurrence of the noise N1 is greater than the third threshold voltage Vth3 and smaller than the fourth threshold voltage Vth4. Accordingly, in this case as well, the operation detecting unit 101 detects neither the operating state of the emergency stop switch 22, nor the occurrence of a short-circuit, based on the voltage of the nose N1. Thus, the detection made at the previous timing is retained. Consequently, the operation detecting unit 101 can correctly detect that the first switch unit 22a or the second switch unit 22b is not being depressed and no short-circuit is occurring.

Likewise, the signal inputted from the terminal 111 due to the occurrence of the noise N2 will have a voltage smaller than the fourth threshold voltage Vth4. However, this voltage is greater than the third threshold voltage Vth3. Therefore, the operation detecting unit 101 detects neither the operating state of the emergency stop switch 22, nor the occurrence of a short-circuit, based on the voltage of the noise N2. Thus, the detection made at the previous timing is retained. Consequently, the operation detecting unit 101 can correctly detect the occurrence of a short-circuit.

As described above, in the industrial control apparatus 30 of the present embodiment, the fourth threshold voltage Vth4 and the amplification factor of the voltage amplifier 130 are set in advance, such that the operation detecting unit 101 can accurately detect the operating state of the emergency stop switch 22 and the occurrence of a short-circuit even when there is mingling of noise. Specifically, experiments or the like are conducted in advance to obtain voltages of signals inputted from the terminal 111 for the cases where noise has mingled in the first circuit C1 in a normal state, and based on which the fourth threshold voltage Vth4 is set to a value greater than the experimentally obtained voltages. Furthermore, the amplification factor of the voltage amplifier 130 is determined such that the input signal to the terminal 111 will have a voltage exceeding such a fourth threshold voltage Vth4 in the occurrence of a short-circuit event, and will have a voltage greater than the third threshold voltage Vth3 when there is mingling of noise.

According to the industrial control apparatus 30 of the present embodiment described above, if the comparison in the amplification command circuit 140 results in agreement, the amplification command circuit 140 outputs an amplification command signal to the voltage amplifier 130 indicating an amplification factor that allows the input signal, i.e. a pre-amplified signal after being amplified, to have a voltage out of the range of detecting depression of the emergency stop switch 22 (the first switch unit 22a or the second switch unit 22b). Consequently, the operation detecting unit 101 of the microcomputer 110 can detect a short-circuit in a short time after receiving the signal inputted from the voltage amplifier 130.

Thus, increase in time taken for detecting a short-circuit can be minimized, compared to detecting a short-circuit based on the reception of a test signal that is periodically supplied in turn to the first and second circuits C1 and C2.

Furthermore, the operation detecting unit 101 of the microcomputer 110 detects the operating state of the emergency stop switch 22 and the occurrence of a short-circuit according the voltage of the signal inputted from the voltage amplifier 130. In this regard, if there is a short-circuit, the voltage amplifier 130 amplifies the pre-amplified signal so as to have a voltage that is out of the range of detecting the operating state of the emergency stop switch 22 based on the amplification command signal Sm, and outputs the amplified signal to the microcomputer 110. Therefore, a single terminal 111 can be used for both inputting the signal for detecting the operating state of the emergency stop switch 22 and inputting the signal for detecting the occurrence of a short-circuit between the first and second circuits C1 and C2. Thus, the number of unoccupied terminals of the microcomputer 110 is less likely to be reduced due to detection of a short-circuit.

In addition, in the occurrence of a short-circuit, the input signal of the first circuit C1 agrees with the input signal of the second circuit C2, which leads to the comparison in the amplification command circuit 140 as resulting in agreement. In this case, the pre-amplified signal is amplified with an amplification factor that allows the voltage to be out of the range of detecting the operating state of the emergency stop switch 22. Thus, the operation detecting unit 101 of the microcomputer 110 can accurately detect the occurrence of a short-circuit and can minimize erroneous detection of a short-circuit. Since the pre-amplified signal is amplified with an amplification factor that allows the voltage to be out of the range of detecting the operating state of the emergency stop switch 22, the amplified signal can be highly accurately specified as to whether the signal indicates the operating state of the emergency stop switch 22 or indicates the occurrence of a short-circuit, thereby minimizing erroneous detection of a short-circuit.

If the comparison in the amplification command circuit 140 indicates agreement, i.e. if a short-circuit has occurred between the first and second circuits C1 and C2, the amplification factor will be one that allows the voltage of the input signal, i.e. a pre-amplified signal after being amplified, to be out of the range (greater than the third threshold voltage Vth3 and smaller than the fourth threshold voltage Vth4) of that of the case where the pre-amplified signal is amplified with an amplification factor of disagreement of the comparison and inputted to the terminal 111 of the microcomputer 110 (i.e. the case where there is no short-circuit) with mingling of noise. Therefore, if noise mingles in the signal when there is no short-circuit, the mingling of noise is prevented from being erroneously detected as being the occurrence of a short-circuit.

B. Modifications

B-1. Modification 1

In the embodiment described above, if there is an input indicating detection of a short-circuit from the input module 100, the programmable logic controller 200 outputs a command signal indicating motion stop of the robot 60 to the output module 300. However, the present disclosure should not be limited to this configuration. For example, alternative to or in addition to the output of such a command signal, a command signal for displaying a message indicating the occurrence of a short-circuit or other messages may be outputted to a monitor, not shown. Alternatively, for example, a command signal may be outputted to an audio output unit, not shown, so that a sound indicating the occurrence of a short-circuit is outputted from a speaker, not shown. Furthermore, for example, an electronic mail indicating the occurrence of a short-circuit may be transmitted to the mailing address of a manager.

B-2. Modification 2

The first and second input circuits 121 and 122 may be omitted from the embodiment described above. With this configuration, the first and second voltage supplying units 191 and 192 supply respective voltages different from each other and applicable to the microcomputer 110.

B-3. Modification 3

In the embodiment described above, two circuits, i.e. the first and second circuits C1 and C2, are connected to the emergency stop switch 22. However, a desired number of circuits may be connected to the emergency stop switch 22. For example, the robot 60 may include three robot units, and the emergency stop switch 22 may include three switch units for the respective robot units. With this configuration of the industrial control apparatus 30 (input module 100), the individual switch units may be connected to respective three circuits, e.g. the first and second circuits C1 and C2 described above and a third circuit. With this configuration, the second circuit C2 may be provided with a voltage amplifier similarly to the first circuit C1. Moreover, with this configuration, the input module may include an amplification command circuit that compares the input from the second circuit C2 with the input from the third circuit to output an amplification command signal.

B-4. Modification 4

In the embodiment described above, the amplification factor in the voltage amplifier 130 in the occurrence of a short-circuit between the first and second circuits C1 and C2 is one that allows the voltage of the amplified signal to be out of the range (greater than the third threshold voltage Vth3 and smaller than the fourth threshold voltage Vth4) of that of the case where the pre-amplified signal is amplified with an amplification factor of the case where there is no short-circuit but there is mingling of noise. However, the present disclosure should not be limited to this configuration. The amplification factor may be one that allows the voltage of the signal after being amplified to be in such a range (greater than the third threshold voltage Vth3 and smaller than the fourth threshold voltage Vth4). With this amplification factor as well, if there is no mingling of noise, high accuracy is ensured when detecting the operating state of the emergency stop switch 22 and the occurrence of a short-circuit.

B-5. Modification 5

In the embodiment and the modifications described above, the short-circuit detection function has been imparted to the input module 100. However, this function may be imparted to the programmable logic controller 200 or the output module 300. Moreover, the first and second circuits C1 and C2 have been connected to the emergency stop switch 22. However, these circuits may be connected to a sensor instead of the emergency stop switch 22. With this configuration, the operation detecting unit 101 detects whether the first and second circuits C1 and C2 are connected to the sensor, and detects the occurrence of a short-circuit between the circuits C1 and C2, based on the input signals from the circuits C1 and C2. In this configuration, the sensor connected to the circuits C1 and C2 corresponds to the subordinate concept of the first device or the second device. Not being limited to the emergency stop switch 22 or sensors, a desired input device for inputting some signal to the industrial control apparatus 30 may be connected to the first and second circuits C1 and C2. The industrial control apparatus 30 is not limited to the robot control system 10 that controls the robot 60 (industrial robot 60), but may be used for controlling any industrial facilities or industrial machinery.

B-6. Modification 6

In the embodiment described above, part of the configuration implemented in the form of hardware may be implemented in the form of software, or vice versa. For example, the operation detecting unit 101 may be implemented by an integrated circuit or discrete circuits, or by a module that is a combination of these circuits. Alternatively, if part or all of the functions of the present disclosure is implemented in the form of software, the software (computer program) may be provided being stored in a computer-readable recording medium. The computer-readable recording medium includes not only a mobile recording medium such as a flexible disc or CD-ROM, but also various internal storage devices such as RAM or ROM in a computer, or an external storage device such as a hard disc integrated in a computer. In other words, the computer-readable recording medium broadly encompasses any recording media that can store a data packet permanently, not temporarily.

The present disclosure should not be construed as being limited to the above embodiment or modifications, but may be implemented in various configurations within a range not departing from the spirit of the disclosure. For example, embodiments corresponding to the technical features in the modes described in the SUMMARY section, or the technical features in the modifications may be appropriately replaced or combined with each other to solve part or all of the issues set forth above, or to achieve part or all of the advantageous effects set forth above. If the technical features are not described as being essential in the present detection, such technical features may be appropriately omitted.

What is claimed is:

1. An industrial control apparatus comprising:
   a microcomputer;
   a first voltage supplying unit that outputs a signal of a first voltage;
   a second voltage supplying unit that outputs a signal of a second voltage different from the first voltage;
   a first circuit that has a first connection terminal and electrically connects the first voltage supplying unit and the microcomputer when a first input device is connected to the first connection terminal;
   a second circuit that has a second connection terminal and electrically connects the second voltage supplying unit and the microcomputer when a second input device is connected to the second connection terminal;
   an amplification command circuit that is electrically connected to the first circuit and the second circuit and compares an input signal from the first circuit with an input signal from the second circuit to output an amplification command signal indicating an amplification factor corresponding to a result of the comparison; and
   a voltage amplifier that is incorporated in the first circuit and electrically connected to the amplification command circuit and, upon reception of the amplification command signal, amplifies a pre-amplified signal with the amplification factor indicated by the amplification command signal for output to the microcomputer, the pre-amplified signal being inputted to the voltage amplifier from the first voltage supplying unit via the first connection terminal, wherein:
   the microcomputer includes an operation detecting unit that detects connection or non-connection of the first input device and occurrence of a short-circuit between the first circuit and the second circuit, based on a voltage of a signal inputted from the voltage amplifier; and the amplification command circuit outputs to the voltage amplifier the amplification command signal indicating an amplification factor that allows the pre-amplified signal after being amplified to have a voltage out of a range of detecting connection or non-connection of the first input device, if the comparison indicates agreement between the input signals.

2. The industrial control apparatus according to claim 1, wherein:

the industrial control apparatus further comprises
a sensor;
an input module that receives an input of a signal outputted from the sensor to convert the signal;
a programmable logic controller that produces a command signal according to the signal converted by the input module; and
an output module that outputs the command signal produced by the programmable logic controller to a robot controller that controls a robot,
the first input device and the second input device respectively serve as switch devices that stop motion of the robot; and
connection or non-connection of the first input device is operation or non-operation of the switch devices.

3. The industrial control apparatus according to claim 1, wherein the amplification factor corresponding to the comparison being agreement allows the pre-amplified signal inputted to the microcomputer after being amplified to have a voltage that is out of a range of the case where noise mingles in the pre-amplified signal after being amplified with an amplification factor corresponding to the comparison being disagreement.

4. The industrial control apparatus according to claim 2, wherein:

the industrial control apparatus further comprises
a sensor;
an input module that receives an input of a signal outputted from the sensor to convert the signal;
a programmable logic controller that produces a command signal according to the signal converted by the input module; and
an output module that outputs the command signal produced by the programmable logic controller to a robot controller that controls a robot,
the first input device and the second input device respectively serve as switch devices that stop motion of the robot; and
connection or non-connection of the first input device is operation or non-operation of the switch devices.

* * * * *